United States Patent [19]

Hasegawa

[11] Patent Number: 5,780,344
[45] Date of Patent: Jul. 14, 1998

[54] METHOD FOR FABRICATING MASK ROM SEMICONDUCTOR DEVICE WITH JUNCTION ISOLATION

[75] Inventor: Masahiro Hasegawa, Fukuyama, Japan

[73] Assignee: Sharp Kabushiki Kaisha, Osaka, Japan

[21] Appl. No.: 707,252

[22] Filed: Sep. 3, 1996

[30] Foreign Application Priority Data

Mar. 13, 1996 [JP] Japan .................................. 8-055915

[51] Int. Cl.$^6$ .................................................. H01L 21/8246
[52] U.S. Cl. ........................... 438/275; 438/420; 438/587
[58] Field of Search ................................. 438/275, 276, 438/277, 278, 414, 420, 587

[56] References Cited

U.S. PATENT DOCUMENTS

| | | | |
|---|---|---|---|
| 5,330,924 | 7/1994 | Huang et al. | 438/587 |
| 5,576,573 | 11/1996 | Su et al. | 438/275 |
| 5,597,753 | 1/1997 | Sheu et al. | 438/275 |

FOREIGN PATENT DOCUMENTS 57-56963  4/1982  Japan .

*Primary Examiner*—Chandra Chaudhari
*Attorney, Agent, or Firm*—Nixon & Vanderhye P.C.

[57] ABSTRACT

A method for fabricating a semiconductor device is provided, which includes the steps of: (i-a) forming at least one impurity region of a first conductivity type in a semiconductor substrate; (ii-a) forming a gate insulation film and a gate electrode on the impurity region of the first conductivity type followed by the formation of impurity diffusion layers of a second conductivity type in self-alignment with the gate electrode to yield plurality of transistors; (iii-a) forming low-concentration impurity layers of the second conductivity type in peripheral portions of the impurity diffusion layers of the second conductivity type; and (iv-a) implanting impurity ions of the first conductivity type into desired regions between the plurality of transistors to form device isolation regions, whereby converting at least a part of the low-concentration impurity layers of the second conductivity type to a low-concentration impurity layers of the first conductivity type.

7 Claims, 12 Drawing Sheets

[1] ——— Concentration profile in P-type layer without double diffusion layer
[2] ——— Concentration profile in P-type layer with double diffusion layer
[3] ------ Profile of $N^+$-$N^-$ double diffusion layer Spacing between PN junction isolation region and diffusion layer (μm)

Overlap margin and lateral impurity diffusion from isolation diffusion layer are considered.

Spacing between PN junction isolation region and diffusion layer 5,780,344

METHOD FOR FABRICATING MASK ROM SEMICONDUCTOR DEVICE WITH JUNCTION ISOLATION

BACKGROUND OF THE INVENTION

1. Field of the Invention

The present invention relates to a method for fabricating a semiconductor device. More particularly, the invention relates to a method for fabricating a semiconductor device in which the device isolation is achieved without utilizing LOCOS films.

2. Description of Related Arts

In MOS devices, device isolation is achieved by utilizing PN junction and/or a low dielectric film. This device isolation technology is employed to prevent a reduction in the breakdown voltage of a device due to punch-through and the channel formation of a parasitic transistor caused by gate interconnection or metallization.

As shown in FIG. 15, a conventional mask ROM includes a memory cell array (flat cell) M employing PN junction isolation and a peripheral circuitry C employing an LOCOS isolation film 47. With reference to FIG. 15, a method for fabricating the conventional mask ROM will be described.

A P-well 42 having a surface impurity concentration of about $1 \times 10^{17}/cm^3$ is formed in a silicon substrate 40. An oxide film and a silicon nitride film are then formed on the entire surface of the silicon substrate 40. A resist pattern having a window on a region in which an LOCOS film is to be formed is formed on the substrate 40 by conventional photolithography and etching techniques. The silicon nitride film is patterned by using the resist pattern as a mask.

After the resist pattern is removed, boron ions are implanted into the silicon substrate 40 in a dose of $7 \times 10^{13}/cm^2$ at an implantation energy of 15 keV by using the patterned silicon nitride film as a mask to form a channel stopper just below the LOCOS film formation region.

In turn, pyrolytic oxidation is carried out at 950° C. by using the silicon nitride film as a mask to form an LOCOS film 47 having a thickness of 600 nm. Thus, the channel stopper 48 is formed just below the LOCOS film 47.

The silicon nitride film is removed by using hot phosphoric acid, and then boron ions are implanted into the substrate in a dose of $2.5 \times 10^{12}/cm^2$ at an implantation energy of 20 keV to adjust the threshold voltage of an N-channel transistor to be formed in the P-well 42.

Arsenic ions are implanted into the substrate masked with a resist pattern in a dose of $2.0 \times 10^{15}/cm^2$ at an implantation energy of 40 keV. After the resist pattern is removed, the substrate is annealed at 900° C. for 30 minutes to form diffused bit lines 51 in the memory cell array M.

Subsequently, a gate electrode 52 is formed by a conventional process. Boron ions are implanted into the substrate 40 which is masked with a photoresist in the peripheral circuitry C and with the gate electrode 52 in the memory cell array M in a dose of $3 \times 10^{13}/cm^2$ at an implantation energy of 20 keV to form a junction isolation region (not shown) for isolating the diffused bit lines 51 from each other.

After the photoresist is removed, an oxide film having a thickness of 250 nm is formed on the resulting substrate, and etched back for formation of spacers 55 on sidewalls of the gate electrode 52. With the use of a photoresist for masking the memory cell array M, an $N^+$ diffusion layer 57 is formed in the peripheral circuitry C.

In turn, boron ions are implanted into desired channel regions 59 in the memory cell array M in a dose of $2 \times 10^{14}/cm^2$ at an implantation energy of 180 keV by using a photoresist as a mask for the ROM programming. Thus, transistors having a high threshold voltage are formed.

After the photoresist is removed, interlayer insulation films 60 and 61, contact holes and metal interconnections 62 are formed by conventional processes. Thus, the mask ROM is completed.

There will next be described a conventional junction isolation method disclosed in U.S. Pat. No. 4,458,262 (Japanese Unexamined Patent Publication No. 57-56963 (1982)).

As shown in FIG. 16, an $N^+$ diffusion layer 71 is formed in a P-type silicon substrate 70. Then, as shown in FIG. 17, a photoresist 72 is formed on the substrate 70, and boron ions are implanted into the substrate in a dose of $2 \times 10^{14}/cm^2$ by using the photoresist 72 as a mask to form a $P^+$ diffusion layer 73.

After the photoresist 72 is removed, as shown in FIG. 18, the substrate is subjected to a heat treatment for activation of the impurities and for recovery of the crystallinity of the silicon substrate 70 and, thus, the junction isolation is achieved.

The aforesaid process for the LOCOS isolation in the peripheral circuitry of the mask ROM accounts for 10% to 15% of the overall mask ROM fabrication process, and takes three to four days, resulting in a prolonged production period and costly production. Further, the LOCOS isolation roughens the substrate surface. This hinders microfabrication and thereby results in a reduced yield.

The PN junction isolation in the memory cell array suppresses the reduction in the breakdown voltage due to punch-through between diffused bit lines, and prevents the channel inversion of a parasitic transistor which would otherwise be caused by metal interconnection. However, since a very thin gate insulation film is formed in a region just below a gate electrode where the channel inversion of a parasitic transistor should be prevented, the channel inversion of the parasitic transistor caused by the gate electrode cannot be prevented with a presently utilized level of impurity concentration of the well or of the PN junction isolation region. Accordingly, the PN junction isolation cannot be employed for the device isolation in the peripheral circuitry.

The PN junction isolation is required to have a high impurity concentration for the prevention of the channel inversion of the parasitic transistor caused by the gate electrode. The gate electrode disposed in contact with the diffusion layer, however, leads to an increase in the junction capacitance and a reduction in the junction breakdown voltage.

For example, the junction breakdown voltage decreases with an increase in the impurity concentration at a PN junction isolation surface, as shown in FIG. 4. Therefore, where the impurity concentration at the PN junction isolation surface is higher than about $3 \times 10^{17}/cm^3$ in a device operable at a voltage of 5V, it is impossible to provide a junction breakdown voltage of higher than 6V. To ensure a junction breakdown voltage of at least 6V while allowing the PN junction isolation region to have a relatively high surface impurity concentration, e.g., $1 \times 10^{18}/cm^3$, the PN junction isolation region should be spaced apart from the diffusion layer by not less than 0.4 æm, as shown in FIG. 19. In consideration of a necessary overlap margin and the lateral diffusion of impurity from the junction isolation region, the spacing between the PN junction isolation region and the diffusion layer should be not less than 0.6 μm as shown in FIG. 20. This leads to limited device microfabrication.

SUMMARY OF THE INVENTION

In accordance with one aspect of the present invention, there is provided a method for fabricating a semiconductor device, which includes the steps of: (i-a) forming at least one impurity region of a first conductivity type in a semiconductor substrate; (ii-a) forming a gate insulation film and a gate electrode on the impurity region of the first conductivity type followed by the formation of impurity diffusion layers of a second conductivity type in self-alignment with the gate electrode to yield a plurality of transistors; (iii-a) forming low-concentration impurity layers of the second conductivity type in peripheral portions of the impurity diffusion layers of the second conductivity type; and (iv-a) implanting impurity ions of the first conductivity type into desired regions between the plurality of the transistors to form device isolation regions, whereby converting at least a part of the low-concentration impurity layers of the second conductivity type to a low-concentration impurity layers of the first conductivity type.

In accordance with another aspect of the present invention, there is provided a method for fabricating a mask ROM, which includes the steps of: (i-b) forming at least one impurity region of a first conductivity type in each of a memory cell array portion and a peripheral circuitry portion of a semiconductor substrate; (ii-b) forming a plurality of impurity diffusion layers of a second conductivity type extending parallel to each other in the memory cell array portion; (iii-b) (a) forming impurity diffusion layers of a second conductivity type in the impurity region of the first conductivity type in the peripheral circuitry portion and forming low-concentration impurity layers of the second conductivity type in peripheral portions of the impurity diffusion layers of the second conductivity type, and (b) forming a gate insulation film and a gate electrode on the memory cell array portion and the peripheral circuitry portion of the semiconductor substrate, respectively, the substep (a) either preceding or following the substep (b); (iv-b) implanting an impurity of the first conductivity type into the entire substrate; and (v-b) implanting impurity ions of the first conductivity type into portions below selected gate electrode in the memory cell array portion for data writing to desired memory cells and into desired regions of the peripheral circuitry portion for formation of device isolation regions, whereby converting at least a part of the low-concentration impurity layers of the second conductivity type to a low-concentration impurity layers of the first conductivity type.

It is an object of the present invention to provide a highly reliable fabrication method for a semiconductor device, which achieves isolation of adjacent transistors without the use of LOCOS isolation but with junction isolation by controlling the junction breakdown voltage and junction capacitance to virtually avoid operational problems. Such a fabrication method realizes microfabrication of the semiconductor device at a reduced production cost in a shorter period with an improved production yield.

DETAILED DESCRIPTION OF THE PREFERRED EMBODIMENTS

Figure 1:
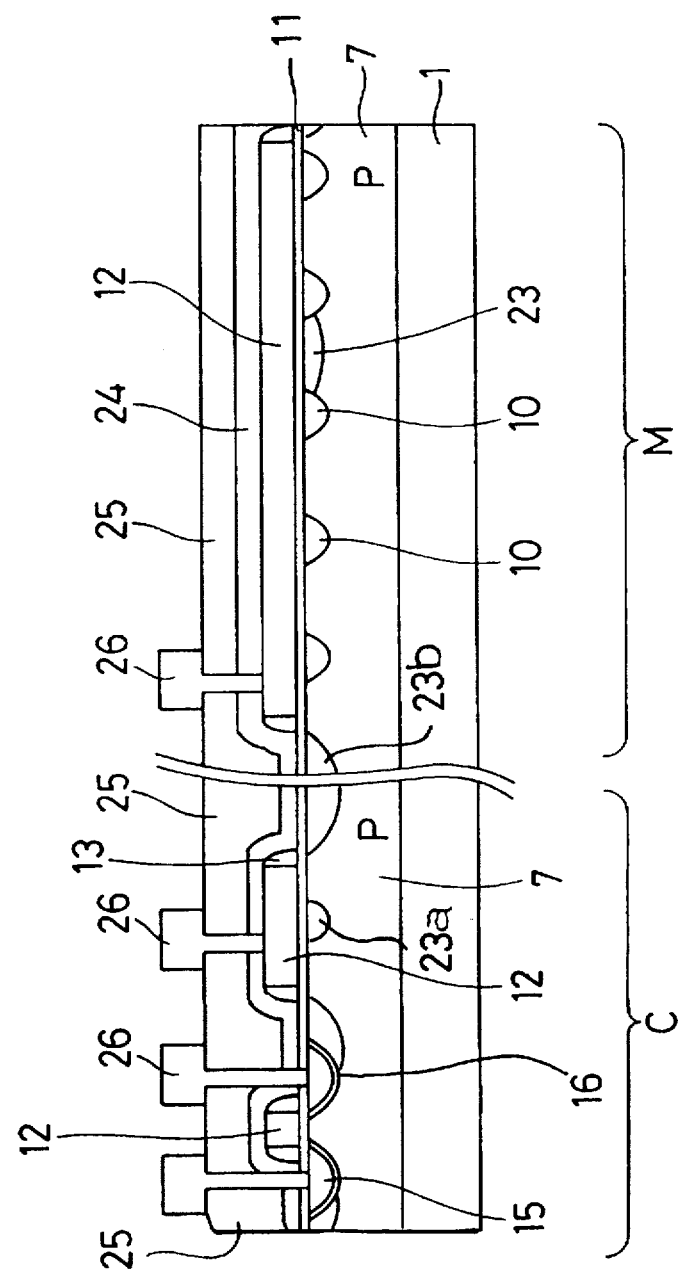
FIG. 1 is a schematic sectional view illustrating major portions of an exemplary mask ROM according to the present invention.

A semiconductor substrate to be used in the fabrication method for a semiconductor device according to the present invention is not particularly limited, but may be any of those typically employed for the fabrication of semiconductor devices, mask ROMs and the like. One preferable example thereof is a silicon substrate.

In the step (i-a), at least one P-type or N-type impurity region is formed in the semiconductor substrate. The size and number of the impurity regions are appropriately adjusted depending on circuits to be formed thereon. One P-type or N-type impurity region may be formed in the entire surface portion of the semiconductor substrate. Alternatively, one or more pairs of P-type and N-type impurity regions may be formed to form complementary circuits or the like on the semiconductor substrate.

The formation of the impurity region is achieved by implanting impurity ions such as boron, As or P ions into the semiconductor substrate by a known method. Implantation conditions are appropriately controlled depending on the impurity concentration of the impurity region to be formed. For example, the impurity ions are preferably implanted in a dose of about $5 \times 10^{12}/cm^2$ to about $1 \times 10^{14}/cm^2$ at an implantation energy that allows the impurity ions to be implanted to such a depth that a desired operation of the impurity region can be ensured, e.g., at about 20 keV to about 180 keV. The impurity concentration and the surface impurity concentration of the impurity region are preferably about $5 \times 10^{16}/cm^3$ to about $2 \times 10^{17}/cm^3$.

In the step (ii-a), a gate insulation film and a gate electrode are formed on the impurity region, and then impurity diffusion layers of a conductivity type different from that of the impurity region are formed in self-alignment with the gate electrode for formation of a plurality of transistors. The gate insulation film for the transistors is preferably formed of $SiO_2$. The material for the gate electrode is not particularly limited, but may be any of those typically used for an interconnection layer. Examples thereof include polysilicon, silicides and polycides. The formation of the gate insulation film and the gate electrode is achieved by a known method such as CVD or sputtering. The thicknesses of the gate insulation film and the gate electrode are not particularly limited, but appropriately adjusted depending on the size of the transistors to be formed. The gate electrode may each have sidewall spacers, and the diffusion layers may have an LDD structure. For the formation of the diffusion layers, a mask pattern having a desired configuration may be formed, which is used along with the gate electrode as a mask.

The impurity concentration of the diffusion layers is preferably about $1 \times 10^{20}/cm^3$ to about $1 \times 10^{21}/cm^3$, and the ion implantation dose is preferably about $1 \times 10^{15}/cm^2$ to about $3 \times 10^{15}/cm^2$. The implantation energy is appropriately adjusted depending on the size of the transistors to be formed and the depth of the diffusion layers, but is preferably about 20 keV to about 50 keV. The ion implantation preferably employs an implantation angle of about 90° with respect to the surface of the semiconductor substrate. At this time, the diffusion layers may be imparted with an LDD structure with the sidewall spacers formed on the gate electrode. In the explanation of the fabrication method of the present invention, the diffusion layers are formed by using the gate electrode as a mask. Alternatively, the plurality of diffusion layers may be first formed by using a resist pattern, and then the gate electrode is formed as extending perpendicular to these diffusion layers.

In the step (iii-a), a low-concentration impurity layer of the same conductivity type as that of the impurity diffusion layers is formed in a peripheral portion of each of the impurity diffusion layers. At least a part of the low-concentration impurity layer is converted to the opposite conductivity type when an impurity of an opposite conductivity type is thereafter implanted into a region adjacent to the low-concentration impurity layer for device isolation, in other words, when device isolation regions are formed in the step (iv-a).

At this time, the low-concentration impurity layer has an impurity concentration sufficient to allow the completed semiconductor device to have a desired junction breakdown voltage, and has a width substantially equivalent to that of a depletion layer which appears when a predetermined operation voltage is applied.

More specifically, the impurity ions are preferably implanted into the substrate at an angle of about 45° to about 60° with respect to a line normal to the substrate surface by using the resist pattern formed in the previous step while the substrate is rotated about an axis perpendicular to the substrate surface. The ion implantation energy is appropriately adjusted depending on the species of impurity ions to be employed, the impurity concentration of the impurity region, the depth of the diffusion layer and the ion implantation angle. Where phosphorus is employed, the ion implantation energy is preferably about 150 keV to about 200 keV. The ion implantation preferably employs a dose of about $5 \times 10^{13}/cm^2$ to about $1 \times 10^{14}/cm^2$ so that the low-concentration impurity layer has an impurity concentration of about $7 \times 10^{17}/cm^3$ to about $2 \times 10^{18}/cm^3$.

Impurity ions of the same conductivity type as that of the impurity region may be thereafter implanted into the entire surface portion of the substrate before the step (iv-a). Where the impurity region has a surface impurity concentration of about $3 \times 10^{17}/cm^3$ to about $1 \times 10^{18}/cm^3$, the ion implantation preferably employs a dose of $1 \times 10^{13}/cm^2$ to $3 \times 10^{13}/cm^2$ and an implantation energy of 20 keV to 70 keV.

Figure 3:
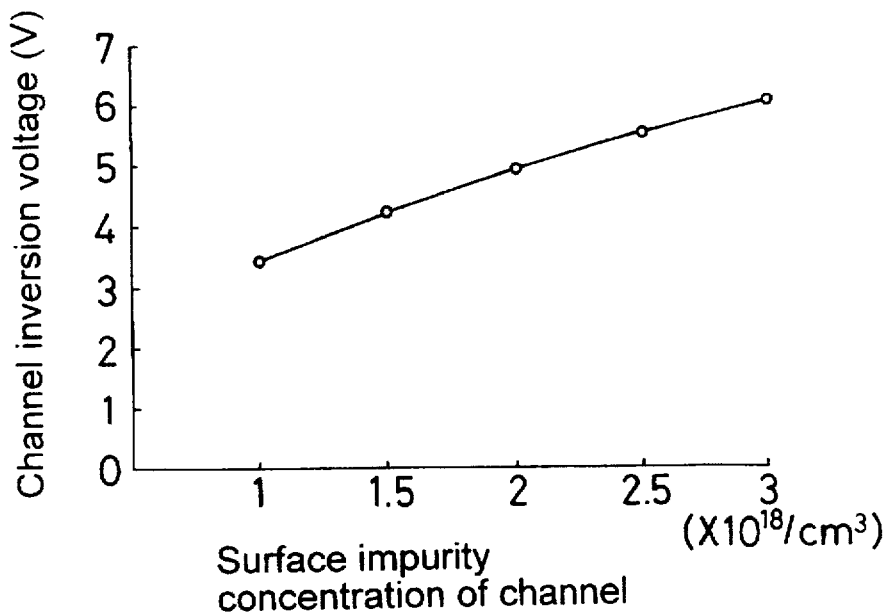
FIG. 3 is a graphical representation illustrating the relationship of the surface impurity concentration of a channel versus the channel inversion voltage.

In the step (iv-a), device isolation regions are formed in desired regions between the plurality of transistors. The formation of the device isolation regions is achieved by implanting ions of the same conductivity type as that of the impurity region formed with the transistors. Where the impurity region is of P-type and the channel inversion voltage (threshold voltage) of a parasitic transistor below a gate electrode is to be adjusted to a level higher than a supply voltage, e.g., 3.3V, the impurity concentration thereof should be not lower than $1 \times 10^{18}/cm^3$ as shown in FIG. 3. Where the channel inversion voltage is to be adjusted to a level higher than 6V, the impurity concentration should be not lower than $3 \times 10^{18}/cm^3$. Therefore, the impurity concentration of the device isolation region can be appropriately adjusted depending on the supply voltage to be employed. For example, the ion implantation preferably employs a dose of about $1 \times 10^{14}/cm^2$ to about $3 \times 10^{14}/cm^2$ and an implantation energy of about 110 keV to about 200 keV to adjust the impurity concentration to about $1.5 \times 10^{18}/cm^3$ to about $3 \times 10^{18}/cm^3$. Thus, at least a part of the low-concentration impurity layers formed in the step (iii-a) are converted to low-concentration impurity layers of an opposite conductivity type. When the impurity ions are implanted into the entire surface of the substrate in step (iv-a) or (iii-a), the whole peripheral portions of the low impurity concentration layers are converted to low impurity concentration layers of the opposite conductivity type.

Figure 5:
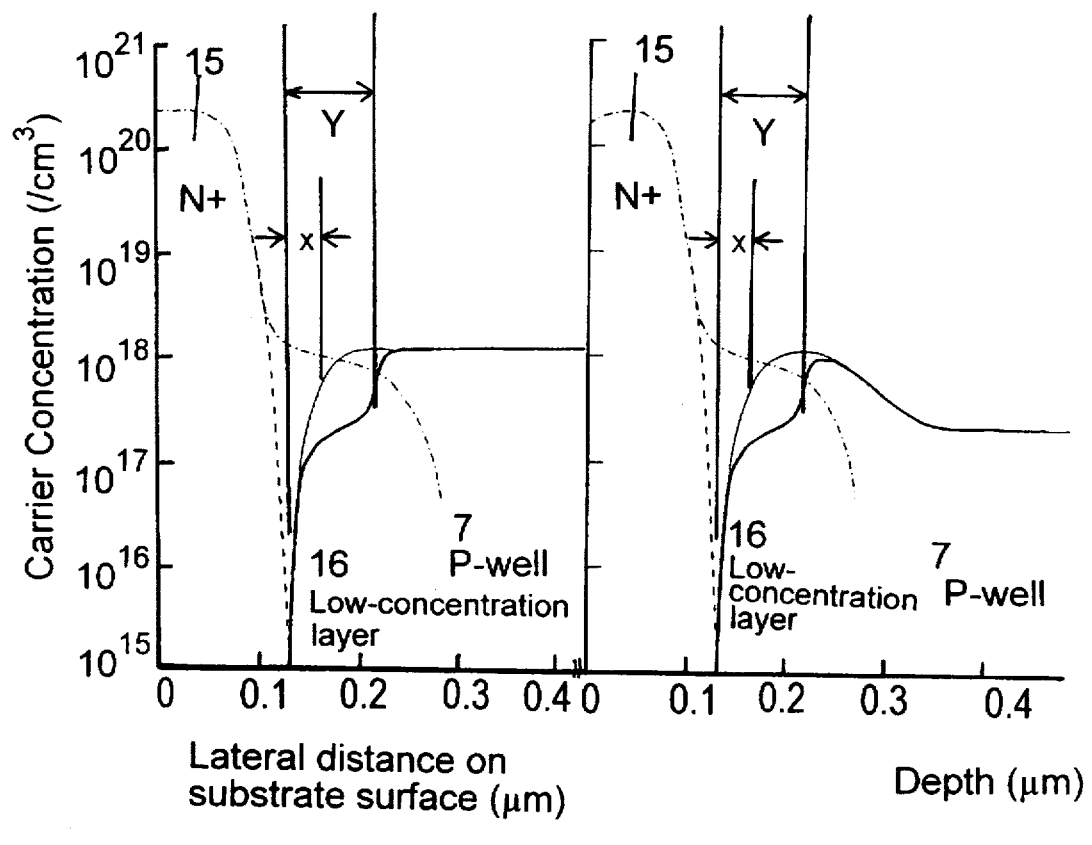
FIG. 5 is a graphical representation illustrating impurity concentration profiles along a lateral direction and along a depthwise direction in a substrate surface portion around a diffusion layer.
Figure 6:
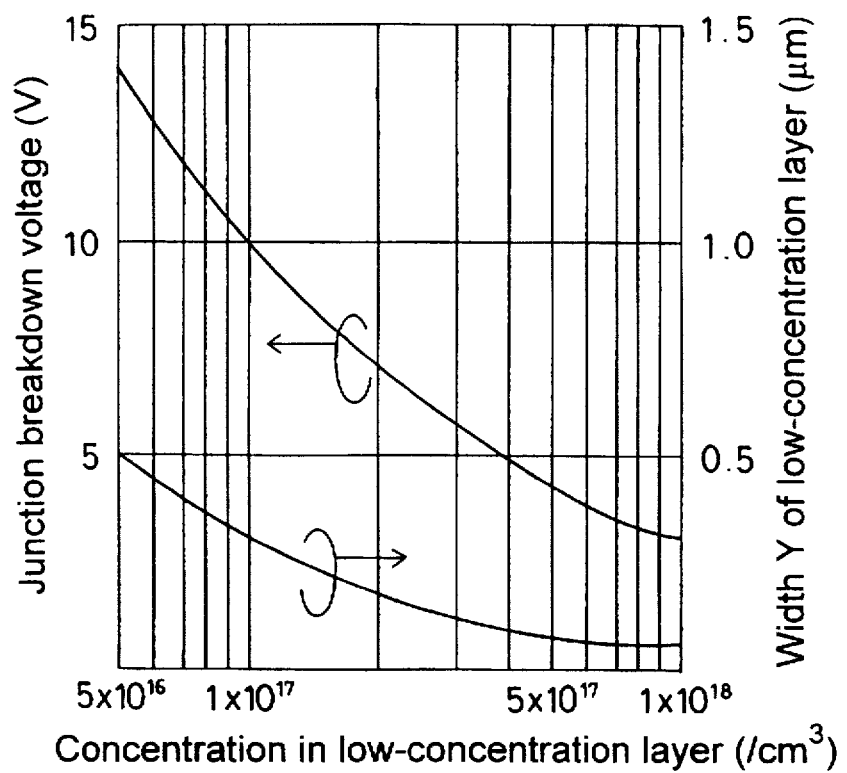
FIG. 6 is a graphical representation illustrating the relationship of the impurity concentration of a low-concentration layer versus the width of the low-concentration layer and the junction breakdown voltage.

The desired junction breakdown voltage can be ensured by allowing the low-concentration impurity layer in the peripheral portion of the diffusion layer of a transistor to have a desired impurity concentration and width as indicated by bold line in FIG. 5. Where the low-concentration impurity layer has an impurity concentration of $1 \times 10^{17}/cm^3$ as shown in FIG. 6, for example, a junction breakdown voltage of 10V can be ensured by adjusting the width of the low-concentration impurity layer to at least about 0.3 μm and, when the transistor is operated at 5V, the width Y of the depletion layer is increased to a level substantially equivalent to that of the low-concentration impurity layer. Thus, it is necessary to determine the impurity concentration and width of the low-concentration impurity layer so that an appropriate junction breakdown voltage can be ensured depending on the transistor operation voltage. Where the supply voltage is about 5V, the impurity concentration and width of the low-concentration impurity layer are preferably about $3 \times 10^{17}/cm^3$ and about 0.1 μm, respectively. In this case, the junction breakdown voltage is 6V, which is sufficient for operation of the transistor. During the operation of the transistor at 5V, the width Y of the depletion layer is substantially equivalent to that of the low-concentration impurity layer.

The semiconductor device with such a construction is preferably provided in peripheral circuitry of a mask ROM, or may be provided in peripheral circuitry of a DRAM or an SRAM. The semiconductor device can be used in combination with a device of a different type such as a resistor or a capacitor. Where the semiconductor device is provided in the peripheral circuitry portion, the memory cell array may be formed on the same substrate or on a different substrate.

In the mask ROM fabrication method of the present invention, an impurity region is formed, in the step (i-b), in the same manner as in the step (i-a).

In the step (ii-b), a plurality of impurity diffusion layers extending parallel to each other are formed in a memory cell array portion. The formation of the impurity diffusion layers is achieved by implanting impurity ions of a conductivity type different from that of the impurity region in a dose of about $1\times10^{15}/cm^2$ to about $3\times10^{15}/cm^2$ at an implantation energy of about 20 keV to about 50 keV to allow the impurity diffusion layers to have an impurity concentration of about $1\times10^{20}/cm^3$ to about $1\times10^{21}/cm^3$.

In the substep (a) of the step (iii-b), impurity diffusion layers which are to serve as diffusion layers of a transistor are formed in the impurity region in a peripheral circuitry portion, and then a low-concentration impurity layer having the same conductivity type as that of the diffusion layers is formed in a peripheral portion of each of the diffusion layers. The formation of the diffusion layers and the formation of the low-concentration impurity layers are achieved in the same manner as in the steps (ii-a) and (iii-a), respectively.

In the substep (b) of the step (iii-b), a gate insulation film and a gate electrode are formed on the memory cell array portion and peripheral circuitry portion of the semiconductor substrate. Thus, the memory cell array portion and the peripheral circuitry portion are each formed with a plurality of transistors.

In the step (iii-b), the substep (a) may either precede or follow the substep (b), but the substep (a) preferably follows the substep (b) since it is preferred in terms of integration level that the diffusion layers and the low-concentration impurity layers provided in the peripheral portions thereof are formed in self-alignment with the gate electrode. The memory cell array portion and the peripheral circuitry portion are preferably simultaneously subjected to a process for forming the gate insulation film and the gate electrode, but may be separately subjected thereto in any order.

In the step (iv-b), an impurity of the first conductivity type is implanted into the entire surface portion of the resulting substrate.

In the step (v-b), data are written to memory cells, and device isolation is established in the peripheral circuitry portion. More specifically, for the data writing to the memory cells, impurity ions of the same conductivity type as that of the impurity region are implanted through the gate electrode into the memory cell array portion of the substrate masked with a resist pattern having openings only on channel provision regions of desired transistors in a memory cell array and into the peripheral circuitry portion of the substrate masked with a resist pattern having openings on desired regions. The implantation energy and the impurity concentration are appropriately adjusted so that the transistors in the memory cell array have a desired threshold voltage. To allow the impurity region to have an impurity concentration of about $1.5\times10^{18}/cm^3$ to about $3\times10^{18}/cm^3$, the ion implantation employs a dose of about $1\times10^{14}/cm^2$ to about $3\times10^{14}/cm^2$ and an implantation energy of about 110 keV to about 200 keV. Thus, at least a part of the low-concentration impurity layers formed in the step (iii-b) is converted to a low-concentration impurity layers of an opposite conductivity type.

With reference to the attached drawings, there will next be described a fabrication method for a mask ROM which is one example of the semiconductor device according to the present invention.

Figure 2:
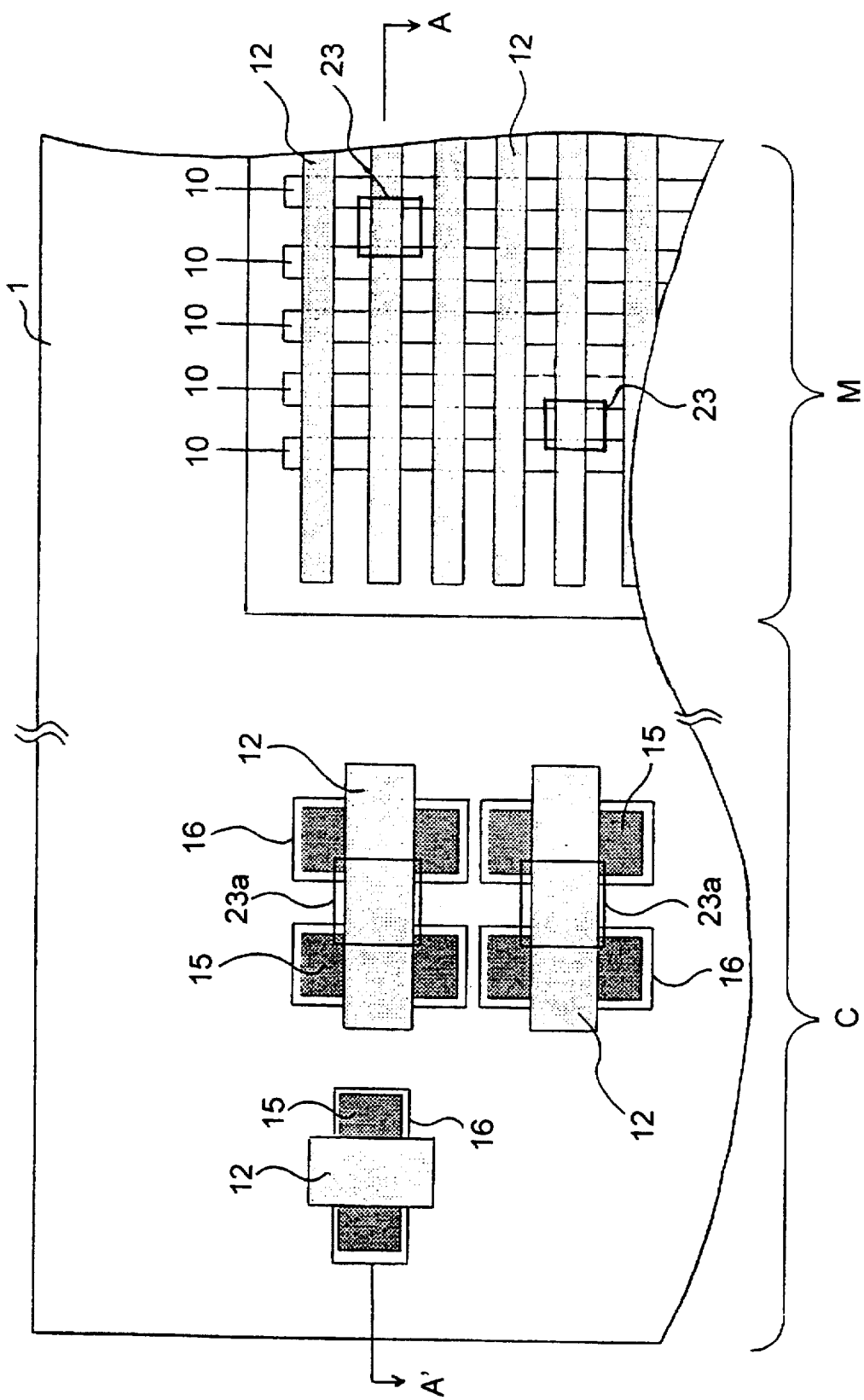
FIG. 2 is a schematic plan view illustrating the major portions of the mask ROM of FIG. 1.

FIGS. 1 and 2 are a sectional view and a plan view, respectively, of the mask ROM according to the present invention. Referring to FIGS. 1 and 2, the mask ROM includes a memory cell array portion M and a peripheral circuitry portion C. In the peripheral circuitry portion C is formed a P-well 7 as a P-type impurity region having a plurality of transistors. The transistors each have a gate insulation film 11 formed on a semiconductor substrate 1, a gate electrode 12 provided with spacers on sidewalls thereof, diffusion layers 15 formed as N-type impurity diffusion layers in self-alignment with the gate electrode 12. A low-concentration layer 16 is formed as a P-type low-concentration impurity layer in a peripheral portion of each of the diffusion layers 15 in self-alignment therewith. While the transistors are each connected to a desired interconnection layer 26 through interlayer insulation films 24 and 25, adjacent transistors are isolated from each other by a PN junction isolation region (device isolation region 23a) without a conventionally utilized LOCOS film. For the device isolation by the junction isolation region, the surface impurity concentration of the P-well 7 just below the gate electrode 12 is adjusted to about $2.5\times10^{18}/cm^3$, which is higher than a conventional level. The impurity concentration is such that the threshold voltage of a parasitic transistor appearing just below the gate electrode or interconnection layer connecting adjacent transistors is set higher than a power supply voltage.

FIG. 3 shows the relationship of the channel inversion voltage (threshold voltage) versus the surface impurity concentration of a channel of a transistor subjected to ion implantation and thereby having a higher threshold voltage under the conditions where the gate insulation film has a thickness of 200 Å, the ambient temperature is 25°C., and the voltage $V_{BS}$ applied between the source and the substrate is zero. In accordance with the present invention, the implantation for the device isolation in the peripheral circuitry portion C is performed simultaneously with the implantation for the ROM programming. To prevent the action of the parasitic transistor below the interconnection, as seen from FIG. 3, the surface impurity concentration of the channel needs to be higher than $1.0\times10^{18}/cm^3$ when the power supply voltage is 3.3V, and to be higher than $2\times10^{18}/cm^3$ when the power supply voltage is 5V.

Figure 4:
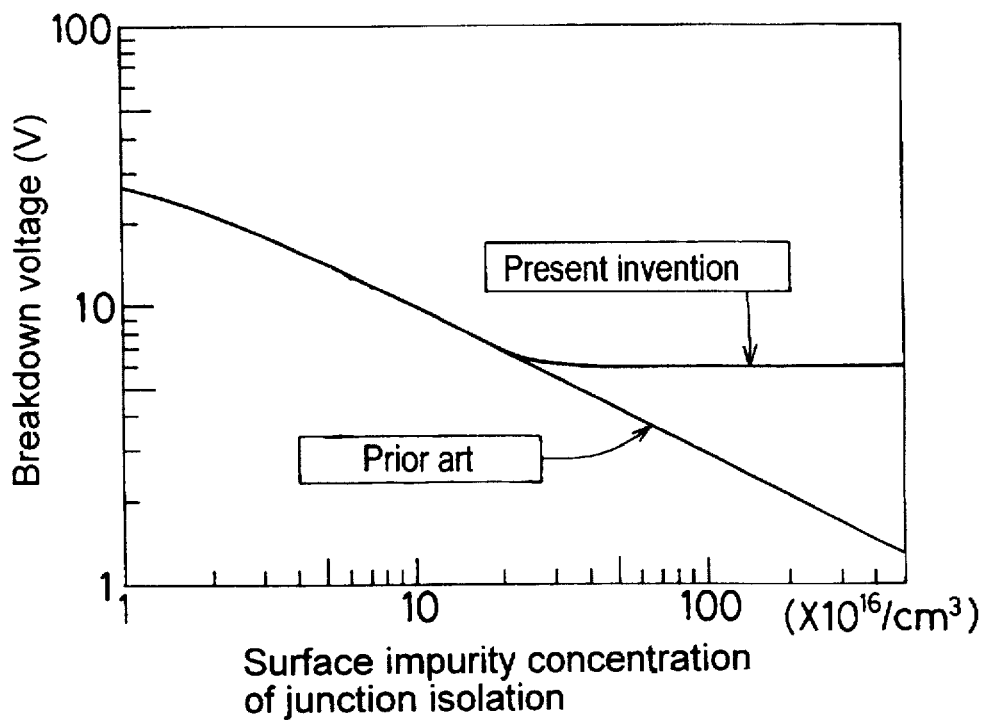
FIG. 4 is a graphical representation illustrating the relationship of the surface impurity concentration of a junction isolation region versus the channel inversion voltage.

As shown in FIG. 4 which illustrates the relationship of the surface impurity concentration of the junction isolation region versus the junction breakdown voltage, the junction breakdown voltage of a conventional semiconductor device decreases with an increase in the surface impurity concentration of the junction isolation region. On the other hand, the junction breakdown voltage of the semiconductor device according to this embodiment is maintained constant even if an impurity is implanted into an adjacent region for junction isolation, because the P-type low-concentration impurity layers 16 are formed in self-alignment with the N-type impurity diffusion layers 15 in the peripheral portions thereof.

FIG. 5 shows an impurity concentration profile observed from the diffusion layer 15 through the low-concentration layer 16 to the P-well 7. Where the P-well 7 having a high impurity concentration is located adjacent to a transistor as in the prior art shown by thin line in FIG. 5, the width X of a depletion layer appearing when an operational voltage is applied to the transistor is small and, hence, the junction breakdown voltage is low. On the other hand, where the low-concentration layer 16 is formed between the diffusion layer 15 and the P-well 7 having a high impurity concentration as in the present invention shown by bold line in FIG. 5, the width Y of the depletion layer appearing when an operational voltage is applied to the transistor is increased and, hence, a desired junction breakdown voltage can be ensured. Since the width Y of the depletion layer increases with a decrease in the impurity concentration of the low-concentration layer 16 as shown in FIG. 6, a required breakdown voltage can be ensured.

Figure 7:
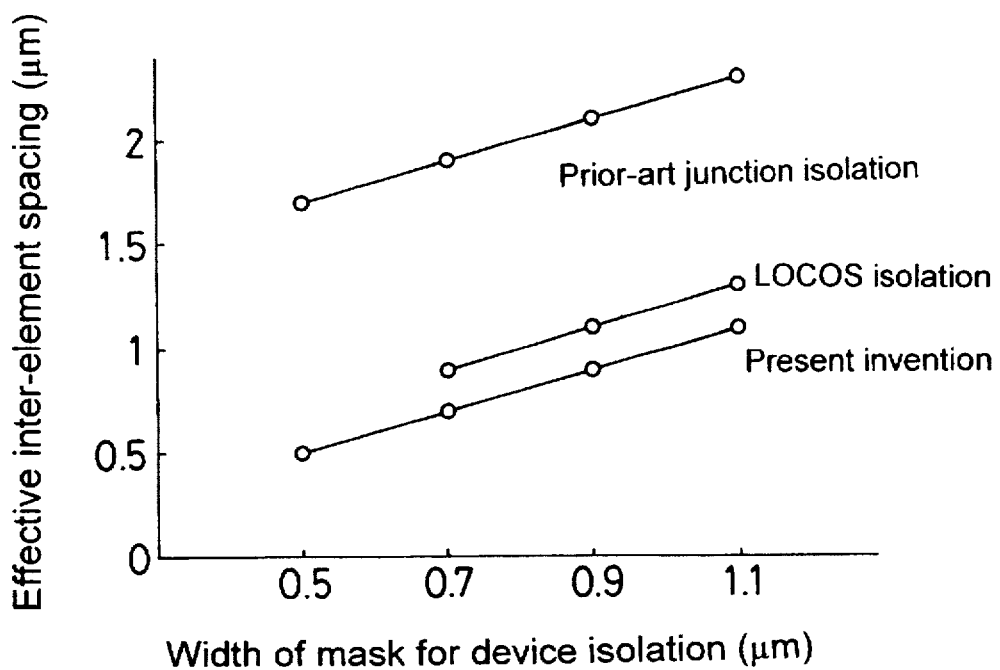
FIG. 7 is a graphical representation illustrating the relationship of the width of a mask for device isolation versus the effective inter-element spacing.
Figure 8:
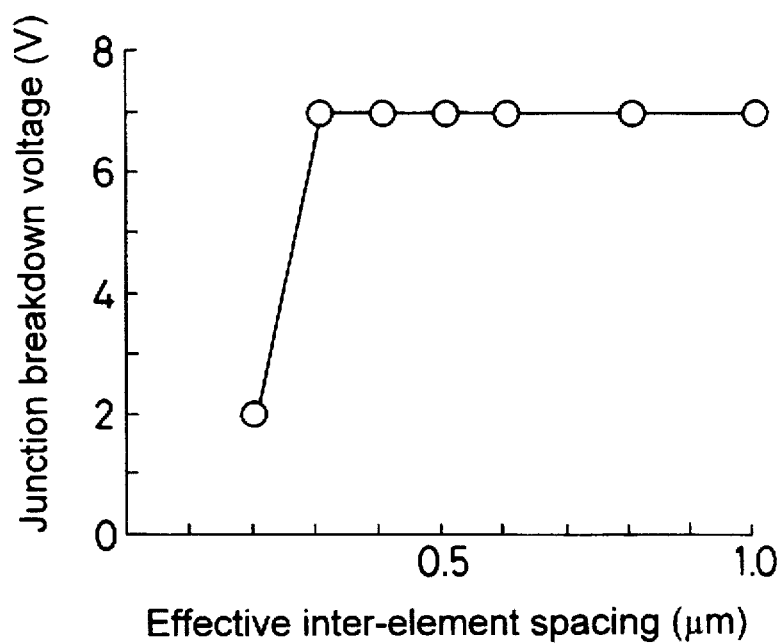
FIG. 8 is a graphical representation illustrating the relationship of the effective inter-element spacing versus the junction breakdown voltage.

Further, the low-concentration layers 16 formed in self-alignment with the diffusion layers 15 permit a layout margin between the diffusion layer 15 or 19 and the PN junction isolation region to be reduced to 0 μm. This means that the diffusion layer 15 can virtually be brought into contact with the PN junction isolation region via the low-concentration layer 16. Therefore, the effective inter-element spacing can be rendered substantially equivalent to the width of the device isolation region as shown in FIG. 7. As apparent from FIG. 8, a required junction breakdown voltage can be ensured with an effective inter-element spacing of about 0.3 μm.

In the mask ROM of the foregoing embodiment, the reduction in the breakdown voltage which may otherwise be caused by punch-through and the action of the parasitic transistor appearing below the interconnection layer can be prevented by maintaining the surface impurity concentration of the junction isolation region at a high level. The low-concentration layers 16 formed in self-alignment with the diffusion layers 15 in the peripheral portions thereof reduce the junction capacitance essential to the PN junction isolation region, and increase the surface impurity concentration of the PN junction isolation region. Therefore, a desired junction breakdown voltage can be ensured even if the width of the PN junction isolation region is reduced. Thus, the device isolation can be achieved by way of the PN junction isolation without employing LOCOS isolation, thereby reducing the number of process steps for the fabrication of the mask ROM.

There will next be described a fabrication method for the mask ROM shown in FIGS. 1 and 2.

Figure 9:
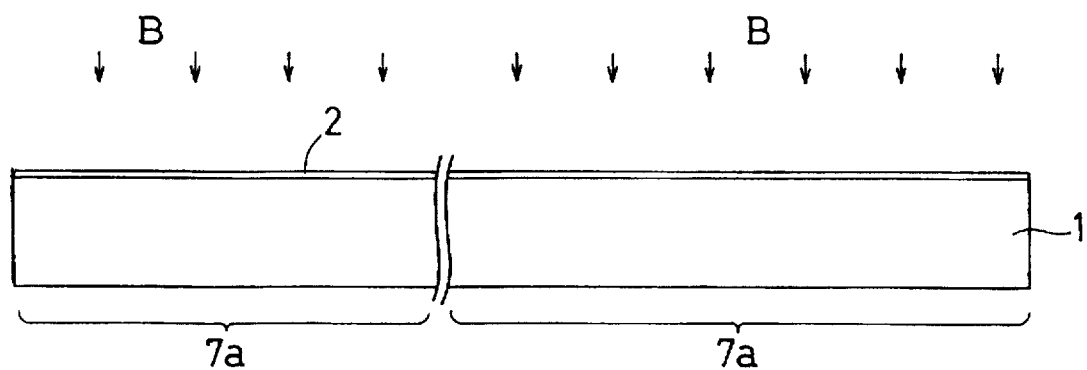
FIGS. 9 to 15 are schematic sectional views illustrating essential steps of a fabrication method for the mask ROM according to the present invention.
Figure 10:
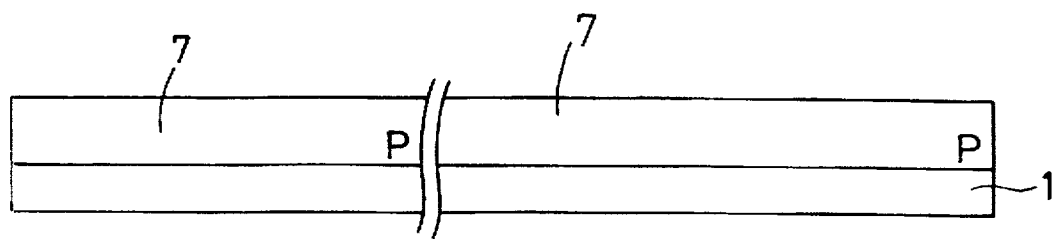

As shown in FIG. 9, a 20 nm-thick thermal oxide film 2 is formed on a surface of a silicon substrate 1, and then boron ions are implanted into a P-well formation region 7a of the substrate in a dose of $1 \times 10^{12}/cm^2$ at an implantation energy of 20 keV. Thereafter, the P-well 7 is formed as shown in FIG. 10 by annealing the resulting substrate at 1,100° C. for two hours for well-driving. Then, the thermal oxide film 2 is removed with hydrofluoric acid.

Figure 11:
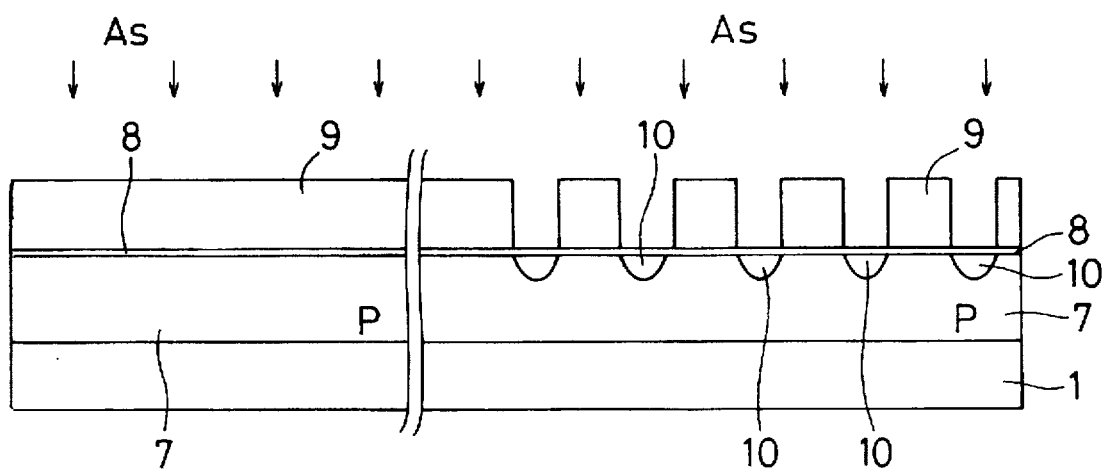

Subsequently, a 20 nm-thick oxide film 8 is formed on the entire surface of the silicon substrate 1 as shown in FIG. 11. A resist is applied on the oxide film 8 and formed into a resist pattern 9 having a desired configuration by photolithographic and RIE processes. For formation of diffused bit line interconnections 10, arsenic ions are implanted into a memory cell array portion M of the substrate in a dose of $3 \times 10^{15}/cm^2$ at an implantation energy of 40 keV with the use of the resist pattern 9 as a mask.

Figure 12:
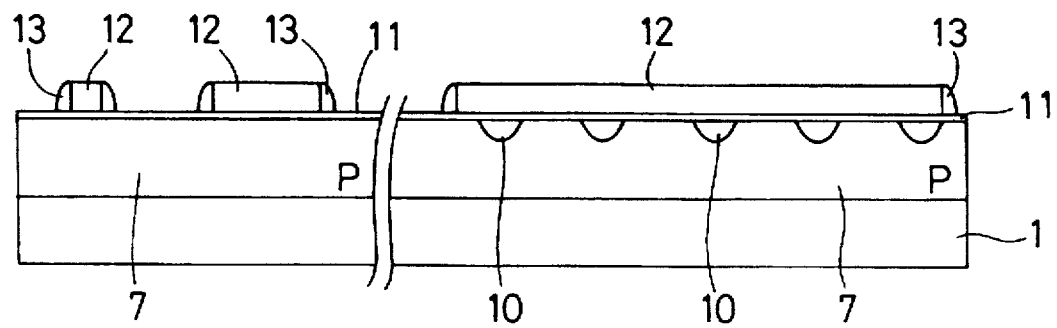

After the resist pattern 9 and the oxide film 8 are removed, a 20 nm-thick gate oxide film 11 and a 350 nm-thick polysilicon film are successively formed on the resulting substrate by common methods as shown in FIG. 12, and then phosphorus ions are diffused into the polysilicon film. In turn, the polysilicon film is patterned into a desired configuration to form gate electrodes 12. To suppress the action of a parasitic transistor appearing due to metal interconnections, boron ions are implanted into the resulting substrate in a dose of $3 \times 10^{13}/cm^2$ at an implantation energy of 20 keV with the use of the gate electrodes as a mask (as indicated by a reference character 23b). Thereafter, an oxide film is formed on the resulting substrate and etched by an RIE method to form spacers 13.

Figure 13:
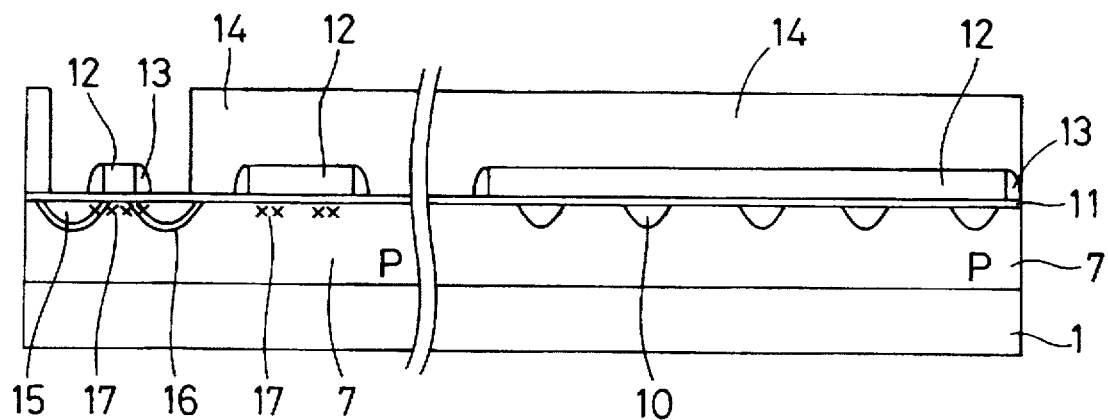

As shown in FIG. 13, a mask pattern 14 for formation of $N^+$ diffusion layers is formed by using a photoresist.

Although a mask pattern to be used at this stage in the prior art is formed to cover only the memory cell array portion M and have a large window on a peripheral circuitry portion C, the mask pattern 14 according to this embodiment has openings only on regions in the peripheral circuitry portion C where transistors are to be formed. By using the mask pattern 14, arsenic ions are implanted into the substrate in a dose of $3 \times 10^{15}/cm^2$ at an implantation energy of 40 keV to form the $N^+$ diffusion layers 15. Further, by using the mask pattern 14, phosphorus ions are implanted into the substrate in a dose of $7.5 \times 10^{13}/cm^2$ at an implantation energy of 200 keV at an implantation angle of 60° with respect to the surface of the substrate 1 while the substrate (wafer) is rotated about a center axis thereof. Thus, low-concentration layers 16 are formed in the P-well 7. Therefore, the low-concentration layers 16 can be formed in a self-alignment manner only in peripheral portions of the $N^+$ diffusion layers 15 in the peripheral circuitry portion C by using the single mask provided for the formation of the $N^+$ diffusion layers.

Figure 14:
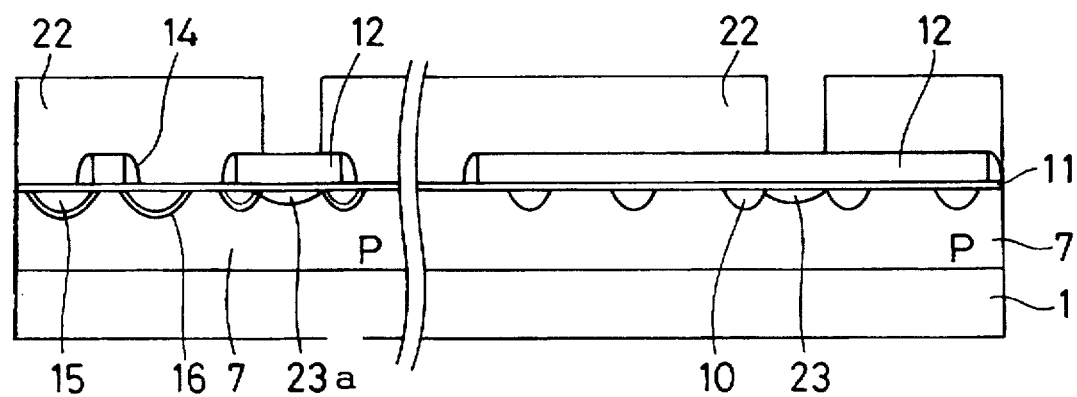
Figure 15:
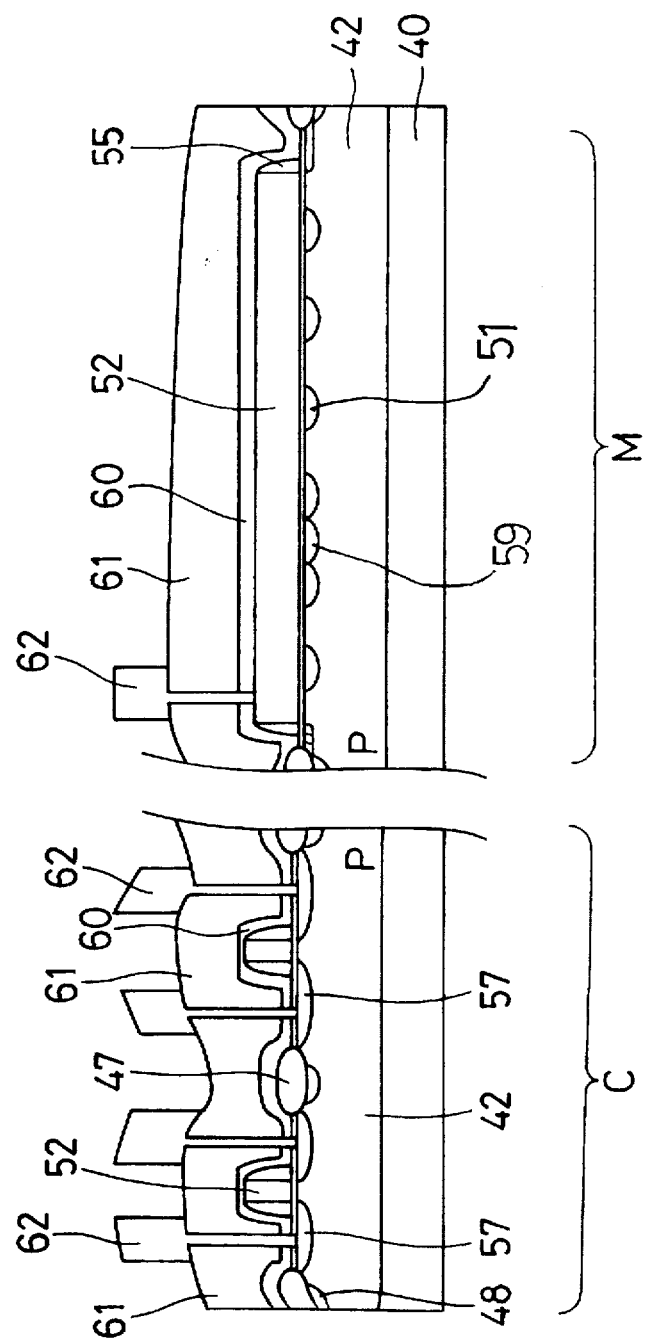
Figure 16:
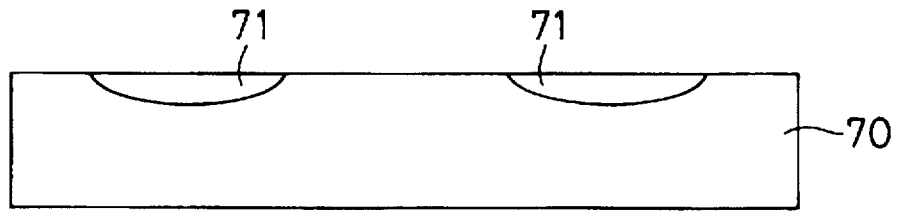
FIGS. 16 to 18 are schematic sectional views illustrating essential steps for formation of a junction isolation region of a conventional semiconductor device.
Figure 17:
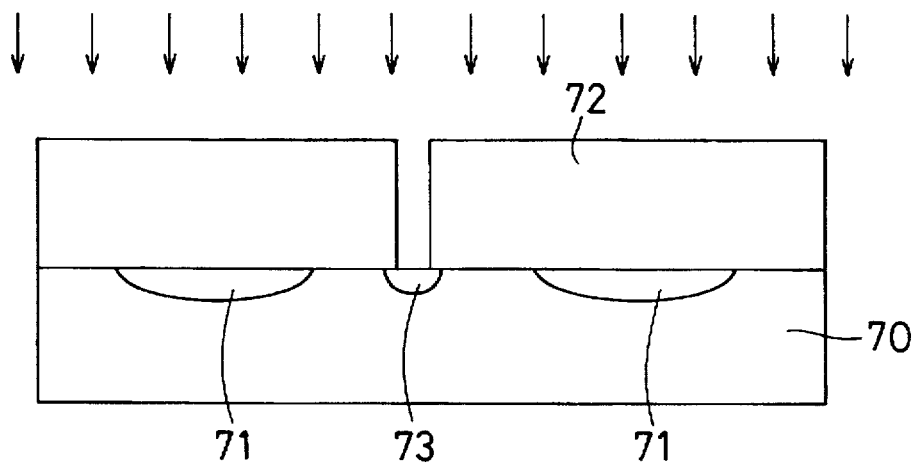
Figure 18:
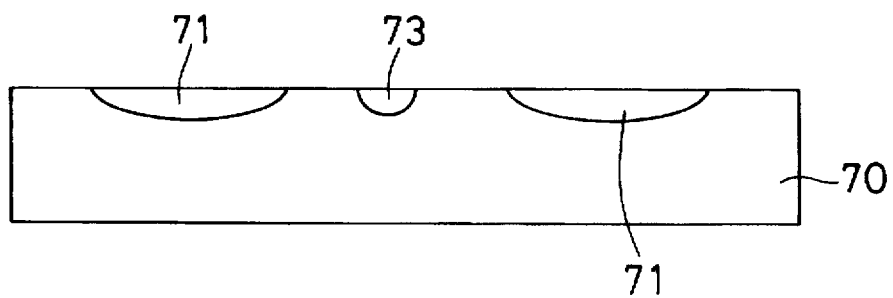
Figure 19:
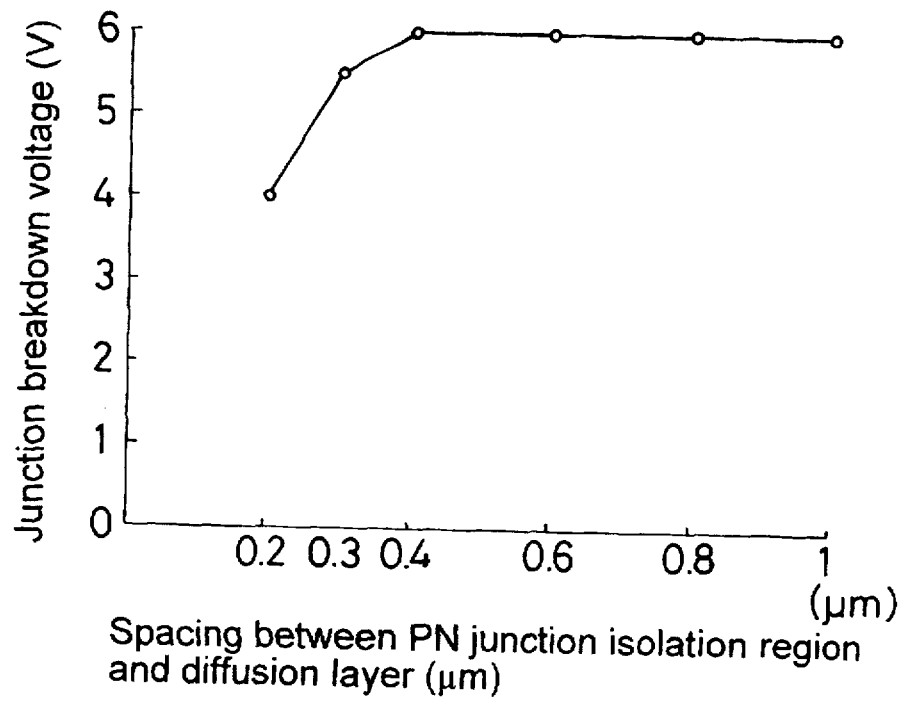
FIG. 19 is a graphical representation illustrating the relationship of the junction breakdown voltage versus the spacing between a PN junction isolation and a diffusion layer in the prior art.
Figure 20:
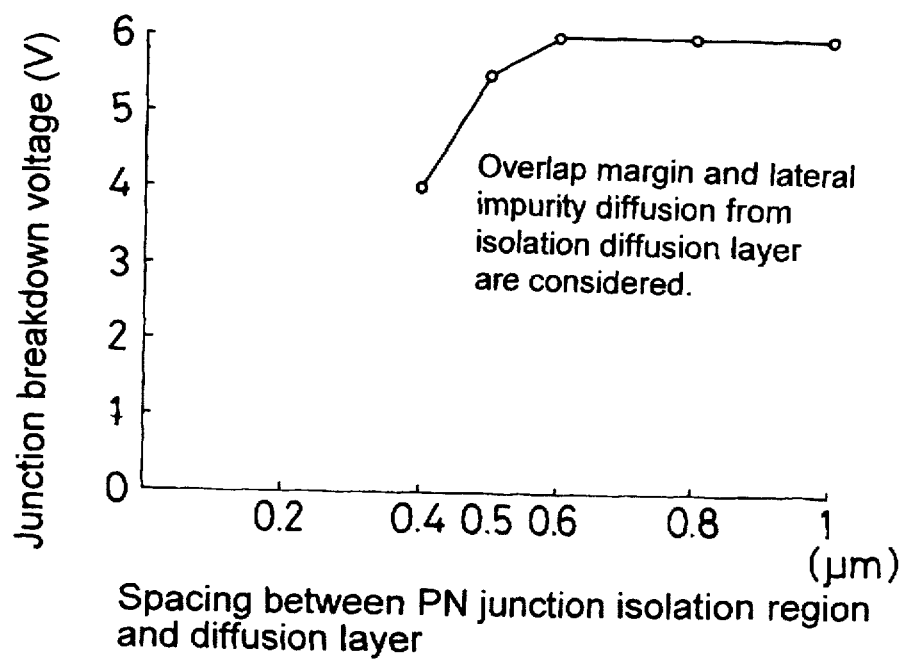
FIG. 20 is a graphical representation illustrating the relationship of the junction breakdown voltage versus the spacing between a PN junction isolation region and a diffusion layer where an overlap margin and lateral impurity diffusion from an isolation diffusion layer are considered in the prior art.

As shown in FIG. 14, boron ions are implanted into the memory cell array portion M in a dose of $8 \times 10^{13}/cm^2$ at an implantation energy of 130 keV with the use of a photoresist 22 as a mask for data writing to memory cells. The photoresist 22 on the peripheral circuitry portion C has windows on regions for junction isolation. Therefore, the formation of the junction isolation region (indicated by a reference character 23a in FIG. 1) in the peripheral circuitry portion C is achieved simultaneously with the data writing in the memory cell array portion M.

Thereafter, the resulting substrate is subjected to a heat treatment for the activation of the ion-implanted layers and for the recovery of crystallinity of the silicon substrate by way of conventional techniques. Then, an NSG film 24 and a BPSG film 25 are formed as an interlayer insulation film, followed by the formation of contact windows and metal interconnections 26. Thus, the mask ROM shown in FIGS. 1 and 2 is completed.

In accordance with the present invention, the device isolation is achieved by employing a relatively high impurity concentration such that the threshold voltage of the parasitic transistor appearing below the gate electrode interconnecting transistors is set higher than a power supply voltage. Therefore, a reduction in the junction breakdown voltage which may otherwise be caused due to punch-through and the action of the parasitic transistor can be prevented. Further, since the low-concentration layers of the same conductivity type as that of the impurity region are formed in self-alignment with the diffusion layers in a part or the whole of the peripheral portions thereof, the junction capacitance of the PN junction isolation can be reduced even if the junction isolation region has a high surface impurity concentration. Therefore, a desired junction breakdown voltage can be ensured even if the width of the PN junction isolation region and the spacing between the junction region and the diffusion layer are reduced. Thus, the isolation of adjacent transistors can be achieved by way of the PN junction isolation without employing the LOCOS isolation, thereby realizing a highly reliable semiconductor device which has a planarized surface and permits highly dense integration.

The mask ROM fabrication method of the present invention enjoys the aforesaid advantages and, in addition, simplifies the process steps because it achieves the device isolation simultaneously with the ion implantation for the ROM programming.

The present invention, which dispenses with the provision of the LOCOS isolation, reduces the production cost and simplifies the process steps.

While only certain presently preferred embodiments have been described in detail, certain changes and modifications can be made in the embodiments without departing from the spirit and scope of the present invention as defined by the following claims.

What is claimed is:

1. A method for fabricating a semiconductor device, comprising the steps of:
   (i-a) forming at least one impurity region of a first conductivity type in a semiconductor substrate;
   (ii-a) forming a gate insulation film and a gate electrode on the impurity region of the first conductivity type followed by the formation of impurity diffusion layers of a second conductivity type in self-alignment with the gate electrode to yield plurality of transistors;
   (iii-a) forming low-concentration impurity layers of the second conductivity type in peripheral portions of the impurity diffusion layers of the second conductivity type; and
   (iv-a) implanting impurity ions of the first conductivity type into desired regions between the plurality of transistors to form device isolation regions, whereby converting at least a part of the low-concentration impurity layers of the second conductivity type to a low-concentration impurity layers of the first conductivity type.

2. A method of claim 1, wherein impurity ions of the first conductivity type are implanted into the entire surface portion of the substrate before the step (iv-a).

3. A method of claim 1, wherein the impurity diffusion layers of the second conductivity type is formed about $1 \times 10^{20}/cm^3$ to about $1 \times 10^{21}/cm^3$ and the low-concentration impurity layers of the second conductivity type is formed about $7 \times 10^{17} cm^3$ to about $2 \times 10^{18}/cm^3$.

4. A method for fabricating a mask ROM, comprising the steps of:
   (i-b) forming at least one impurity region of a first conductivity type in each of a memory cell array portion and a peripheral circuitry portion of a semiconductor substrate;
   (ii-b) forming a plurality of impurity diffusion layers of a second conductivity type extending parallel to each other in the memory cell array portion;
   (iii-b) (a) forming impurity diffusion layers of a second conductivity type in the impurity region of the first conductivity type in the peripheral circuitry portion and forming low-concentration impurity layers of the second conductivity type in peripheral portions of the impurity diffusion layers of the second conductivity type, and (b) forming a gate insulation film and a gate electrode on the memory cell array portion and the peripheral circuitry portion of the semiconductor substrate, respectively, the substep (a) either preceding or following the substep (b);
   (iv-b) implanting an impurity of the first conductivity type into the entire substrate; and
   (v-b) implanting impurity ions of the first conductivity type into portions below selected gate electrode in the memory cell array portion for data writing to desired memory cells and into desired regions of the peripheral circuitry portion for formation of device isolation regions, whereby converting at least a part of the low-concentration impurity layers of the second conductivity type to a low-concentration impurity layers of the first conductivity type.

5. A method of claim 4, wherein the formation of the impurity diffusion layers of the second conductivity type and the low-concentration impurity layers of the second conductivity type in the peripheral portions thereof is achieved in the step (iii-b) by forming the gate insulation film and the gate electrode on the peripheral circuitry portion of the semiconductor substrate, then forming a mask pattern having a desired configuration on the resulting substrate, and implanting ion with use of the mask pattern and the gate electrode as a mask.

6. A method of claim 4, wherein impurity ions of the first conductivity type are implanted into the entire surface portion of the substrate before the step (v-b).

7. A method of claim 4, wherein the impurity diffusion layers of the second conductivity type is formed about $1 \times 10^{20}/cm^3$ to about $1 \times 10^{21}/cm^3$ and the low-concentration impurity layers of the second conductivity type is formed about $7 \times 10^{17} cm^3$ to about $2 \times 10^{18}/cm^3$.

* * * * *